(12) United States Patent
Niu

(10) Patent No.: US 9,484,396 B2
(45) Date of Patent: Nov. 1, 2016

(54) ARRAY SUBSTRATE, METHOD FOR MANUFACTURING THE SAME, DISPLAY DEVICE AND ELECTRONIC PRODUCT

(71) Applicant: BOE TECHNOLOGY GROUP CO., LTD., Beijing (CN)

(72) Inventor: Jing Niu, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 14/420,854

(22) PCT Filed: Apr. 16, 2014

(86) PCT No.: PCT/CN2014/075495
§ 371 (c)(1),
(2) Date: Feb. 10, 2015

(87) PCT Pub. No.: WO2015/109667
PCT Pub. Date: Jul. 30, 2015

(65) Prior Publication Data
US 2015/0214286 A1    Jul. 30, 2015

(30) Foreign Application Priority Data

Jan. 27, 2014    (CN) .......................... 2014 1 0039802

(51) Int. Cl.
*H01L 27/14*    (2006.01)
*H01L 27/32*    (2006.01)
(Continued)

(52) U.S. Cl.
CPC ....... *H01L 27/3276* (2013.01); *H01L 27/1244* (2013.01); *H01L 27/1259* (2013.01); *H01L 27/3248* (2013.01); *H01L 27/3262* (2013.01);
(Continued)

(58) Field of Classification Search
USPC .............................................. 257/72, 88, 40
See application file for complete search history.

(56) References Cited

U.S. PATENT DOCUMENTS

2009/0321725 A1* 12/2009 Yoshida .............. H01L 27/1214
257/40

FOREIGN PATENT DOCUMENTS

| CN | 1731904 A | 2/2006 |
| CN | 101958339 A | 1/2011 |
| CN | 101997025 A | 3/2011 |

(Continued)

OTHER PUBLICATIONS

Office Action in Chinese Patent Application No. 201410039802.3, dated Nov. 26, 2015.

(Continued)

*Primary Examiner* — Timor Karimy
(74) *Attorney, Agent, or Firm* — BakerHostetler LLP

(57) ABSTRACT

The present disclosure provides an array substrate, including a plurality of sub-pixel regions arranged in a matrix form. Each sub-pixel region may at least include a first thin film transistor (TFT) and a second thin film transistor. The first thin film transistor may include a first gate electrode, a first source electrode and a first drain electrode. The second thin film transistor may include a second gate electrode, a second source electrode and a second drain electrode. The first gate electrode and at least one of the second source electrode and the second drain electrode may be provided on a same layer. The second gate electrode and at least one of the first source electrode and the first drain electrode may be provided on a same layer. The second gate electrode and the first source electrode may be integrated together.

15 Claims, 6 Drawing Sheets

(51) Int. Cl.
*H01L 27/12* (2006.01)
*H01L 51/52* (2006.01)
(52) U.S. Cl.
CPC ...... *H01L 51/5284* (2013.01); *H01L 2227/323* (2013.01)

(56) References Cited

FOREIGN PATENT DOCUMENTS

| CN | 102013432 A | 4/2011 |
| CN | 102403333 A | 4/2012 |
| CN | 102466937 A | 5/2012 |
| CN | 102629621 A | 8/2012 |
| CN | 102884633 A | 1/2013 |
| CN | 203707135 U | 7/2014 |

OTHER PUBLICATIONS

International Search Report and Written Opinion in PCT/CN2014/075495, dated Nov. 13, 2014.
Office Action in Chinese Patent Application No. 201410039802.3, dated Mar. 9, 2016.

\* cited by examiner

ARRAY SUBSTRATE, METHOD FOR MANUFACTURING THE SAME, DISPLAY DEVICE AND ELECTRONIC PRODUCT

CROSS-REFERENCE TO RELATED APPLICATION

This application is the U.S. national phase of PCT Application No. PCT/CN2014/075495 filed on Apr. 16, 2014, which claims priority to Chinese Patent Application No. 201410039802.3 filed on Jan. 27, 2014, the disclosures of which are incorporated in their entirety by reference herein.

TECHNICAL FIELD

The present disclosure relates to the field of display technology, in particular to an array substrate, a method for manufacturing the same, a display device and an electronic product.

BACKGROUND

Compared with a cathode ray tube (CRT) or a liquid crystal display (LCD), an organic light emitting display (OLED) has the advantages such as thinner, wider viewing angles, faster response and lower power consumption, etc. Thus, as the next generation display, the OLED has been on the focus.

An array substrate of an OLED generally includes two thin film transistors (TFTs), one of which functions as a switching transistor and the other functions as a driving transistor. FIG. 1 is a plan view showing a partial structure of an array substrate in the prior art, and FIG. 1B is a view showing a cross section of a broken line A-A in FIG. 1A. As shown in FIG. 1A and FIG. 1B, the two TFTs included in the array substrate in the prior art are a first thin film transistor TFT1 and a second thin film transistor TFT2 respectively. The specific layer structure thereof includes a transparent substrate 1, a first gate electrode 101a, a second gate electrode 101b, a gate electrode insulation layer 102, a first active layer 103a, a second active layer 103b, etch stop layer (ESL) 104, a first source electrode 105a, a first drain electrode 106a, a second source electrode 105b, a second drain electrode 106b, a resin layer 107, a metal connecting line 108, a pixel electrode 109, a black matrix 110, an organic light emitting layer 111, a counter electrode 112, a gate line 113, a data line 114 and a power line 115. The gate line 113 is connected to a gate electrode of the first thin film transistor TFT1, i.e., the first gate electrode 101a; the data line 114 is connected to a source electrode of the TFT1, i.e., the first source electrode 105a; the first drain electrode 106a of the first thin film transistor TFT1 is connected to a gate electrode of the second thin film transistor TFT2, i.e., the second gate electrode 101b through a via-hole. The power line 115 is substantially parallel with the data line 114 and connected to a source electrode of the second thin film transistor TFT2, i.e., the second source electrode 105b. A drain electrode of the second thin film transistor TFT2, i.e., the second drain electrode 106b is connected to the pixel electrode 109.

As shown in FIG. 1A and FIG. 1B, both of the first thin film transistor TFT1 and the second thin film transistor TFT2 have bottom gate structures. The first drain electrode 106a is connected to the second gate electrode 101b through a via-hole by the metal connecting line 108 which is provided on a same layer as the pixel electrode 109. The metal connecting line 108 and the pixel electrode 109 may be made of same materials and are conductive. Therefore, in order to avoid short-circuiting, a region overlaid by the pixel electrode 109 needs to be kept away from the metal connecting line 108. As shown in FIG. 1A and FIG. 1B, the organic light emitting layer 111 provided on the corresponding pixel electrode 109 needs also to be kept away from a region overlaid by the metal connecting line 108, and the region overlaid by the metal connecting line 108 is overlaid by the black matrix 110 which divides the sub-pixel regions.

In the above structure having two thin film transistors, when the drain electrode of the first thin film transistor is connected to the gate electrode of the second thin film transistor, a metal connecting line is required to be provided separately. In order to avoid forming a short circuit between the metal connecting line and other conductive metals, the metal connecting line is required be overlaid by insulating materials such as a black matrix, which causes the process to be complex.

SUMMARY

Technical Problem to be Solved

An object of the present disclosure is to provide an array substrate, a method for manufacturing the same, a display device and an electronic product, to solve the problem that a metal connecting line is required to be provided separately to achieve a connection of two thin film transistors in a structure having two thin film transistors in the prior art.

Technical Solutions

The object of the present disclosure is realized through the following technical solutions.

In an aspect, there is provided an array substrate, including a plurality of sub-pixel regions arranged in a matrix form, wherein each sub-pixel region at least includes a first thin film transistor (TFT) and a second thin film transistor. The first thin film transistor includes a first gate electrode, a first source electrode and a first drain electrode, and the second thin film transistor includes a second gate electrode, a second source electrode and a second drain electrode. The first gate electrode and at least one of the second source electrode and the second drain electrode are provided on a same layer. The second gate electrode and at least one of the first source electrode and the first drain electrode are provided on a same layer. The second gate electrode and at least one of the first source electrode and the first drain electrode are integrated together, or the first gate electrode and at least one of the second source electrode and the second drain electrode are integrated together.

Alternatively, the first thin film transistor may function as a switching transistor, and the second thin film transistor may function as a driving transistor. The first gate electrode, the second source electrode and the second drain electrode may be provided on a same layer. The second gate electrode, the first source electrode and the first drain electrode may be provided on a same layer. The second gate electrode and the first source electrode may be integrated together.

In an embodiment of the present disclosure the array substrate may include the first thin film transistor and the second thin film transistor. The gate electrode of the second thin film transistor and the source electrode and the drain electrode of the first thin film transistor may be provided on a same layer, and the gate electrode of the second thin film transistor and the drain electrode of the first thin film transistor may be integrated together. Therefore, there is no need to provide a metal connecting line separately to connect the gate electrode of the second thin film transistor and the source electrode or drain electrode of the first thin film transistor, which simplifies the manufacturing process. Moreover, the array substrate can be applied in OLED displays, which can enlarge the effective light-emitting display regions, and improve the aperture ratio of the OLED displays.

Alternatively, the array substrate may further include a gate line electrically connected to the first gate electrode, and a power line electrically connected to the second source electrode. The gate line, the power line, the first gate electrode, the second source electrode and the second drain electrode may be provided on a same layer, and the gate line may be substantially parallel with the power line.

In an embodiment of the present disclosure, the gate line is substantially parallel with the power line which can avoid short-circuiting. And the power line and the second source electrode are provided on a same layer, which changes the original structure where the power line and the data line are provided on a same layer, and enables the power line and the second source electrode to be electrically connected, thereby avoiding a design with excessive via-holes.

Alternatively, the array substrate may further include a first insulation layer located above the first gate electrode, the second source electrode and the second drain electrode; and an active layer and an etch stop layer (ESL) sequentially formed on the first insulation layer by using a same patterning process, which simplifies the manufacturing process. The active layer may include a first active layer and a second active layer, the etch stop layer may include a first etch stop layer and a second etch stop layer. The first active layer may be located above the first gate electrode; the second active layer may be located above the second source electrode and the second drain electrode. The first etch stop layer may overlay a region of the first active layer which is not overlaid by the first source electrode and the first drain electrode, and the second etch stop layer may overlay the second active layer.

Alternatively, the array substrate further may include a first via-hole, a first connecting line, a second via-hole and a second connecting line, thereby achieving the connection of the drain electrode of the second thin film transistor and the active layer. The first connecting line, the second connecting line and the second gate electrode may be provided on a same layer. The second source electrode may be electrically connected to the second active layer through the first connecting line and the first via-hole. The second drain electrode is electrically connected to the second active layer through the second connecting line and the second via-hole.

Alternatively, the first via-hole and the second via-hole may run through the second etch stop layer, the second active layer and the first insulation layer, and reveal a cross section of the second etch stop layer, a partial upper surface of the second active layer and a cross section of the first insulation layer, so that the drain electrode of the second thin film transistor and the active layer are fully contacted with each other.

Alternatively, the array substrate may further include a resin layer and a pixel electrode, located above the first thin film transistor and the second thin film transistor. There may be a third via-hole through the resin layer; the third via-hole may be located above the second drain electrode. The pixel electrode may be electrically connected to the second drain electrode through the third via-hole.

Alternatively, there may provide a black matrix inside the third via-hole in which the pixel electrode is formed, and an upper surface of the black matrix located inside the third via-hole and an upper surface of the pixel electrode located outside the third via-hole may be substantially located in a same horizontal plane, thereby enabling a thickness of the organic light emitting layer formed on the pixel electrode and a brightness of the OLED display to be uniform.

Alternatively, the first insulation layer may be made of a multi-layer composite film which is composed of one or two of silicon oxide (SiOx), silicon nitride (SiNx), hafnium oxide (HfOx), silicon oxynitride (SiON) and AlOx.

In another aspect, there is provided a display device, at least including any of the above array substrate.

In yet another aspect, there is provided an electronic product, at least including any of the above display device.

In an embodiment of the present disclosure the array substrate in the display device includes the first thin film transistor and the second thin film transistor. The gate electrode of the second thin film transistor and the source electrode and the drain electrode of the first thin film transistor are provided on a same layer, and the gate electrode of the second thin film transistor and the drain electrode of the first thin film transistor are integrated together. Therefore, there is no need to provide a metal connecting line separately to connect the gate electrode of the second thin film transistor and the source electrode or drain electrode of the first thin film transistor, which simplifies the manufacturing process. Moreover, the array substrate can be applied in OLED displays, which can enlarge the effective light-emitting display regions, and improve the aperture ratio of the OLED displays.

In another aspect, there is provided a method for manufacturing an array substrate, wherein the array substrate includes a plurality of sub-pixel regions arranged in a matrix form, each sub-pixel region at least includes a first thin film transistor which functions as a switching transistor and a second thin film transistor which functions as a driving transistor, the first thin film transistor includes a first gate electrode, a first source electrode and a first drain electrode, the second thin film transistor includes a second gate electrode, a second source electrode and a second drain electrode. A process for manufacturing the first thin film transistor and the second thin film transistor includes: forming a pattern that includes the first gate electrode, the second source electrode and the second drain electrode, wherein the first gate electrode, the second source electrode and the second drain electrode are provided on a same layer; and forming a pattern that includes the second gate electrode, the first source electrode and the first drain electrode, wherein the second gate electrode, the first source electrode and the first drain electrode are provided on a same layer, and the second gate electrode and the first drain electrode are integrated together.

According to the method for manufacturing the array substrate provided by an embodiment of the present disclosure, an array substrate structure including the first thin film transistor and the second thin film transistor is formed, and the gate electrode of the second thin film transistor and the source electrode and the drain electrode of the first thin film transistor are provided on a same layer, and the gate electrode of the second thin film transistor and the drain electrode of the first thin film transistor are integrated together. Therefore, there is no need to form a metal connecting line to connect the gate electrode of the second thin film transistor and the source electrode or drain electrode of the first thin film transistor, which simplifies the manufacturing process.

Alternatively, the method may further include: forming a gate line and a power line which are arranged on a same layer as the first gate electrode, the second source electrode and the second drain electrode. The gate line may be electrically connected to the first gate electrode, the power line may be electrically connected to the second source electrode, and the gate line may be substantially parallel with the power line.

Alternatively, after the step of forming a pattern that includes the first gate electrode, the second source electrode and the second drain electrode, the method may further include: forming a first insulation layer; and forming, on the first insulation layer by using a same patterning process, a pattern of a first active layer located above the first gate electrode, a pattern of a second active layer located above the second source electrode and the second drain electrode, a pattern of a first etch stop layer overlaying a region of the first active layer which is not overlaid by the first source electrode and the first drain electrode, and a pattern of a second etch stop layer which overlays the second active layer. The active layers and the etch stop layers of the first thin film transistor and the second thin film transistor may be formed through a same patterning process, which can avoid another patterning process, and simplify the manufacturing process.

Alternatively, the method may further include: forming a first via-hole and a second via-hole which reveal a cross section of the second etch stop layer, a partial upper surface of the second active layer and a cross section of the first insulation layer; forming a first connecting line and a second connecting line provided on a same layer as the second gate electrode; connecting electrically the second source electrode and the second active layer through the first connecting line and the first via-hole; and connecting electrically the second drain electrode and the second active layer through the second connecting line and the second via-hole.

In an embodiment of the present disclosure, through the above manner of forming the via-hole, it can be achieved that the active layer of the second thin film transistor and the source/drain electrode are fully contacted with each other.

Alternatively, the method may further include: forming a resin layer; forming a third via-hole configured to connect a pixel electrode and a second drain electrode; forming a patterned pixel electrode; and filling a black matrix inside the third via-hole in which the pixel electrode is formed, so as to enable an upper surface of the black matrix and an upper surface of the pixel electrode to locate substantially in a same horizontal plane.

Beneficial Effects

Embodiments of the present disclosure at least have the following beneficial effects.

In the embodiments of the present disclosure, the black matrix is filled inside the third via-hole in which the pixel electrode is formed, so as to enable the upper surface of the black matrix and the upper surface of the pixel electrode to be located substantially in a same horizontal plane, thereby enabling a thickness of the organic light emitting layer formed on the pixel electrode and a brightness of the OLED display to be uniform.

BRIEF DESCRIPTION OF THE DRAWINGS

In order to more clearly illustrate the technical solutions according to the embodiments of the present disclosure or the prior art, accompany drawings acquired to use in the description of the embodiments will be described briefly below. It is obvious that, the described drawings are merely parts of embodiments of the present disclosure, and other drawings can also be obtained according to these drawings for a person skilled in the art without creative work.

DETAILED DESCRIPTION

Figure 1A:
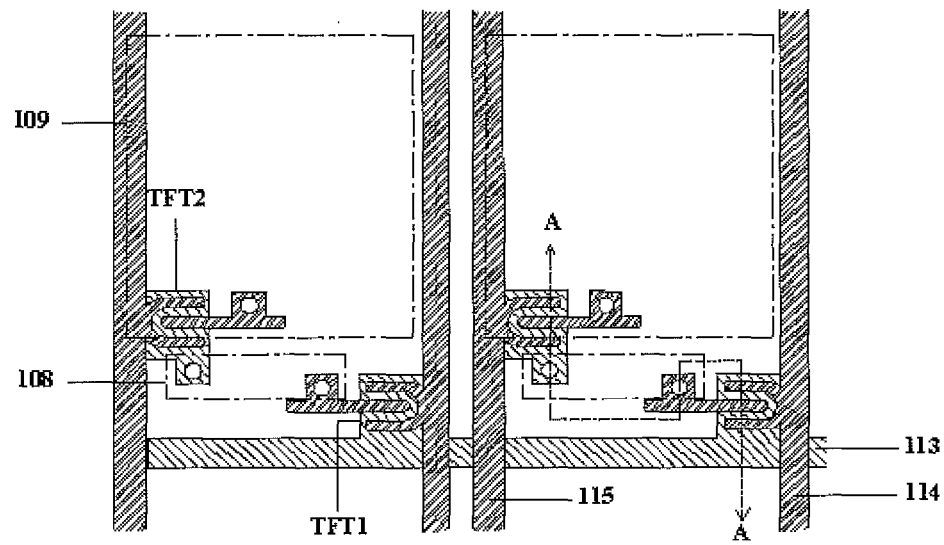
FIG. 1A is a plan view showing a partial structure of an array substrate in the prior art.

Embodiments of the present disclosure will be further described below in conjunction with the accompanying drawings and examples. The following embodiments are merely used to illustrate the present disclosure, but not intended to limit the scope of the present invention.

In order to make the objects, technical solutions and advantages of the embodiments of the present disclosure more clear, the technical solutions according to the embodiments of the present disclosure will be clearly and fully described hereinafter in conjunction with the accompanying drawings in the embodiments of the present disclosure. Obviously, the described embodiments are merely parts of embodiments of the present disclosure, but not all the embodiments. Based on the embodiments in the present disclosure, all the other embodiments obtained by a person skilled in the art will fall within the protection scope of the present disclosure.

Unless otherwise defined, technical terms or scientific terms used herein shall have the general meaning which can be understood by a person skilled in the art. The terms "first", "second" or the like used in the specification and claims of the present disclosure do not denote any sequence, quantity, or importance, but rather are used to distinguish different components. Similarly, the terms "a" or "an" or the like do not mean quantitative restrictions, but rather indicate the presence of at least one. The terms "connect" or "couple" or the like are not limited to connect physically or mechanically, but may include connecting electrically either directly or indirectly. The terms "up", "down", "left", "right", etc., are merely used to indicate a relative positional relationship; when the absolute position of the described object is changed, the relative positional relationship is changed correspondingly.

Principles and features of the present disclosure will be described in conjunction with the accompanying drawings and examples. The following embodiments are merely used to illustrate the present disclosure, but not intended to limit the scope of the present disclosure.

An embodiment of the present disclosure provides an array substrate, including the first thin film transistor TFT1 and the second thin film transistor TFT2. The gate electrode of the second thin film transistor TFT2 and the source electrode/the drain electrode of the first thin film transistor TFT1 are provided on a same layer, and the gate electrode of the second thin film transistor TFT2 and the drain electrode of the first thin film transistor TFT1 are integrated together. Therefore, it can be achieved that the drain electrode of the first thin film transistor and the gate electrode of the second thin film transistor are connected so that there is no need to add a metal connecting line separately, which simplifies the manufacturing process.

In the embodiments of the present disclosure, description will be given below taking an array substrate in an organic light emitting display (OLED) as an example, however, the present disclosure is not limited thereto. The principle of embodiments of the present disclosure may relate to any structure which includes two thin film transistors and in which the two thin film transistors need to be connected.

In the embodiments of the present disclosure, description will be given below with an example where the first thin film transistor TFT1 functions as a switching transistor in a pixel circuit in an OLED display and the second thin film transistor TFT2 functions as a driving transistor.

For convenience of descriptions, in the following embodiments of the present disclosure, the gate electrode of the first thin film transistor TFT1 is represented by a first gate electrode 201a, the source electrode of the first thin film transistor TFT1 is represented by a first source electrode 205a, and the drain electrode of the first thin film transistor TFT1 is represented by a first drain electrode 206a. Moreover, the gate electrode of the second thin film transistor TFT2 is represented by a second gate electrode 201b, the source electrode of the second thin film transistor TFT2 is represented by a second source electrode 205b, and the drain electrode of the second thin film transistor TFT2 is represented by a second drain electrode 206b. Specifically, the first gate electrode 201a, the second source electrode 205b and the second drain electrode 206b are provided on a same layer. The second gate electrode 201b, the first source electrode 205a and the first drain electrode 206a are provided on a same layer, and the second gate electrode 201b and the first drain electrode 206a are integrated together. Therefore, it can be achieved that the drain electrode of the first thin film transistor TFT1 and the gate electrode of the second thin film transistor TFT2 are connected so that there is no need to add a metal connecting line separately, which can enlarge an area of the effective light-emitting display regions, and improve the aperture ratio of the OLED displays.

Figure 2A:
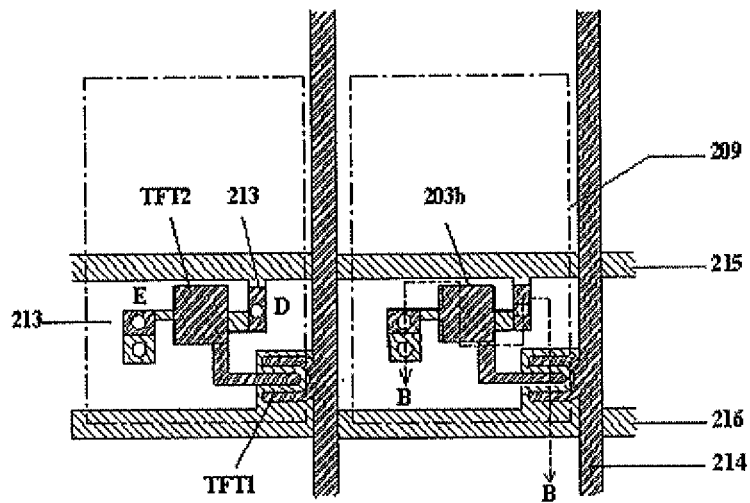
FIG. 2A is a plan view showing a partial structure of an array substrate according to an embodiment of the present disclosure.
Figure 2B:
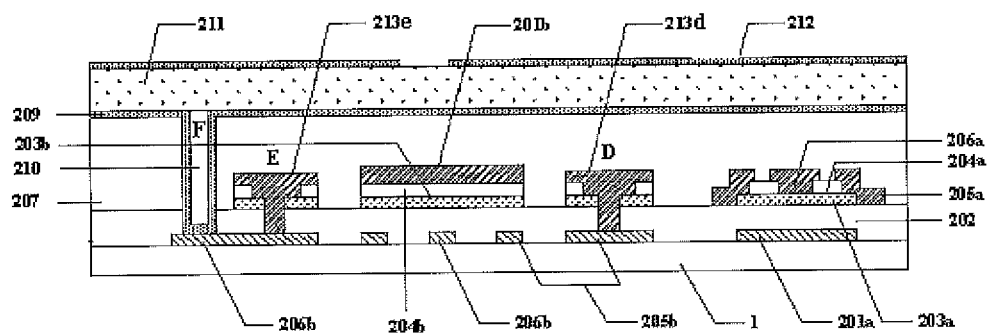
FIG. 2B is a cross-section view showing a partial structure of an array substrate according to an embodiment of the present disclosure.

A structure of the array substrate involved in an embodiment of the present disclosure will be described in detail in conjunction with FIGS. 2A and 2B. FIG. 2A is a plan view showing a partial structure of an array substrate according to an embodiment of the present disclosure. FIG. 2B is a cross-section view showing a partial structure of an array substrate according to an embodiment of the present disclosure.

In an embodiment of the present disclosure, gate lines 216 and data lines 214 formed on a base substrate 1 define a plurality of sub-pixel regions arranged in a matrix form, wherein each of the sub-pixel regions forms an organic light-emitting unit. The organic light-emitting unit of the array substrate includes a first thin film transistor TFT1 having a bottom gate structure and a second thin film transistor TFT2 having a top gate structure. One of them functions as a switching transistor configured to input a data signal, and the other functions as a driving transistor configured to drive the display device to emit light. In an embodiment of the present disclosure, description will be given below with an example where the first thin film transistor TFT1 functions as the switching transistor, and the second thin film transistor TFT2 functions as a driving transistor. However, the present disclosure is not limited thereto.

As shown in FIG. 2A and FIG. 2B, the first gate electrode 201a, the second source electrode 205b and the second drain electrode 206b are provided on a same layer, have a distance arranged between them and are insulated to each other. The array substrate further includes power lines 215 and gate lines 216 provided on a same layer as the first gate electrode 201a, the second source electrode 205b and the second drain electrode 206b. The gate lines 216 and the power lines 215 are arranged substantially parallel with each other. The gate lines 216 each is electrically connected to the first gate electrode 201a, to provide, for example scan signals and control signals, etc., to the first thin film transistor TFT1. The power lines 215 each is connected to the second source electrode 205b to provide, for example power signals, etc., to the second thin film transistor TFT2.

In an embodiment of the present disclosure, the power lines 215 are substantially parallel with the gate lines 216, which can avoid short-circuiting. And the power lines 215 and the second source electrode 205b are provided on a same layer, which changes the original structure where the power lines 215 and the data lines are provided on a same layer, and enables the power lines 215 and the second source electrode 205b to be electrically connected, thereby avoiding a design with excessive via-holes.

Further, the array substrate further includes a first insulation layer 202 located above the first gate electrode 201a, the second source electrode 205b and the second drain electrode 206b; and an active layer and an etch stop layer (ESL) sequentially formed on the first insulation layer 202 by using a same patterning process. The active layer includes a first active layer 203a and a second active layer 203b; and the etch stop layer includes a first etch stop layer 204a and a second etch stop layer 204b.

Specifically, as shown in FIG. 2B, the first active layer 203a is located above the first gate electrode 201a; the second active layer 203b is located above the second source electrode 205b and the second drain electrode 206b. The first etch stop layer 204a overlays a region of the first active layer 203a which is not overlaid by the first source electrode 205a and the first drain electrode 206a, and the second etch stop layer 204b overlays the second active layer 203b.

Further, in order to connect the second active layer 203b, the second source electrode 205b and the second drain electrode 206b, the array substrate further includes a first via-hole D, a first connecting line 213d, a second via-hole E and a second connecting line 213e. The second source electrode 205b is electrically connected to the second active layer 203b through the first connecting line 213d and the first via-hole D. The second drain electrode 206b is electrically connected to the second active layer 203b through the second connecting line 213e and the second via-hole E. Alternatively, the first connecting line 213d, the second connecting line 213e and the second gate electrode 201b are provided on a same layer, to simplify the manufacturing process.

Alternatively, as shown in FIG. 2B, in an embodiment of the present disclosure, the first via-hole D and the second via-hole E run through the second etch stop layer 204b located above the second source electrode 205b and the second drain electrode 206b, the first insulation layer 202 and the second active layer 203b located above the second source electrode 205b and the second drain electrode 206b. Furthermore, the first via-hole D and the second via-hole E reveal a cross section of the second etch stop layer 204b, a partial upper surface of the second active layer 203b and a cross section of the first insulation layer 202, which makes shapes of the first via-hole D and the second via-hole E are stepped shapes. Therefore, a contact area between the second active layer 203b and the first connecting line 213d is enlarged, and a contact area between the second active layer 203b and the second connecting line 213e is enlarged too, so that the electrical connection between the second active layer 203b and the second source electrode 205b as well as the second drain electrode 206b can be more stable.

Alternatively, the array substrate further includes a resin layer 207 and a pixel electrode 209, located above the first thin film transistor TFT1 and the second thin film transistor TFT2. In this embodiment, since there is no need to provide a metal connecting line separately to connect the gate electrode of the second thin film transistor and the source electrode or drain electrode of the first thin film transistor TFT1, the pixel electrode 209 can overlay the entire sub-pixel regions. The resin layer 207 is made of an insulating material, to ensure that the pixel electrode 209, the first thin film transistor TFT1 and/or the second thin film transistor TFT2 will not be short circuited. An upper surface of the resin layer 207 is a horizontal plane, which can function as an overcoat layer, so as to enable a thickness of the organic light emitting layer formed on the pixel electrode to be uniform and ensure a brightness uniformity of the OLED display.

In an embodiment of the present disclosure, the resin layer 207 has a third via-hole F, which is located at a position corresponding to the second drain electrode 206b. The third via-hole F is located above second drain electrode 206b, so that the pixel electrode 209 can be easily electrically connected to the second drain electrode 206b through the third via-hole F. It is obvious that the position of the third via-hole F is not limited thereto. For example, the third via-hole F may be located above the second via-hole E. The electrical connection between the pixel electrode 209 and the second drain electrode 206b can be achieved by the second via-hole E and the second connecting line 213e.

As shown in FIG. 2B, the array substrate may further include an organic light emitting layer 211 formed on the pixel electrode 209 and a counter electrode 212 provided on the organic light emitting layer 211.

Further, in order to ensure a thickness of the organic light emitting layer in the sub-pixel regions to be uniform, there provides a black matrix 210 inside the third via-hole F in which the pixel electrode 209 is formed. An upper surface of the black matrix 210 and an upper surface of the pixel electrode 209 are substantially located in a same horizontal plane, thereby enabling a thickness of the organic light emitting layer 211 formed on the pixel electrode 209 and a brightness of the OLED display to be uniform.

The array substrate provided by the embodiments of the present disclosure includes the first thin film transistor having a bottom gate structure and the second thin film transistor having a top gate structure. The gate electrode of the second thin film transistor and the source electrode and the drain electrode of the first thin film transistor are provided on a same layer, and the gate electrode of the second thin film transistor and the drain electrode of the first thin film transistor are integrated together. Therefore, there is no need to provide a metal connecting line separately to connect the gate electrode of the second thin film transistor and the source electrode or drain electrode of the first thin film transistor, which can enlarge the effective light-emitting display regions, and improve the aperture ratio of the OLED displays.

According to the above array substrate, an embodiment of the present disclosure further provides a method for manufacturing the array substrate.

In this embodiment, the array substrate includes a first thin film transistor and a second thin film transistor. The first thin film transistor includes a first gate electrode, a first source electrode and a first drain electrode. The second thin film transistor includes a second gate electrode, a second source electrode and a second drain electrode. A process for manufacturing the first thin film transistor and the second thin film transistor may include:

A: forming a pattern that includes the first gate electrode, the second source electrode and the second drain electrode, wherein the first gate electrode, the second source electrode and the second drain electrode are provided on a same layer;

B: forming a pattern that includes the second gate electrode, the first source electrode and the first drain electrode, wherein the second gate electrode, the first source electrode and the first drain electrode are provided on a same layer, and the second gate electrode and the first drain electrode are integrated together.

Alternatively, the method further includes: forming a gate line and a power line which are arranged on a same layer as the first gate electrode, the second source electrode and the second drain electrode. The gate line is electrically connected to the first gate electrode, the power line is electrically connected to the second source electrode, and the gate line is substantially parallel with the power line.

Further, after the step of forming a pattern that includes the first gate electrode, the second source electrode and the second drain electrode, the method further includes: forming a first insulation layer; and forming, on the first insulation layer by using a same patterning process, a pattern of a first active layer located above the first gate electrode, a pattern of a second active layer located above the second source electrode and the second drain electrode, a pattern of a first etch stop layer overlaying a region of the first active layer which is not overlaid by the first source electrode and the first drain electrode, and a pattern of a second etch stop layer which overlays the second active layer.

Furthermore, after forming patterns of the first active layer, the second active layer, the first etch stop layer and the second etch stop layer, the method further includes: forming a first via-hole and a second via-hole which reveal a cross section of the second etch stop layer, a partial upper surface of the second active layer and a cross section of the first insulation layer; forming a first connecting line and a second connecting line provided on a same layer as the second gate electrode; connecting electrically the second source electrode and the second active layer through the first connecting line and the first via-hole; and connecting electrically the second drain electrode and the second active layer through the second connecting line and the second via-hole.

Alternatively, after completing the above steps, the method further includes: forming a resin layer; forming a third via-hole configured to connect a pixel electrode and a second drain electrode; forming a patterned pixel electrode; and filling a black matrix inside the third via-hole in which the pixel electrode is formed, so as to enable an upper surface of the black matrix and an upper surface of the pixel electrode to be located substantially in a same horizontal plane.

The method for manufacturing the array substrate will be described in detail in conjunction with a specific application.

Description will be given below with an example where an array substrate of an OLED device is manufactured. The array substrate includes a first thin film transistor TFT1 and a second thin film transistor TFT2. The first thin film transistor TFT1 includes a first gate electrode 201*a*, a first source electrode 205*a* and a first drain electrode 206*a*. The second thin film transistor TFT2 includes a second gate electrode 201*b*, a second source electrode 205*b* and a second drain electrode 206*b*.

Figure 3:
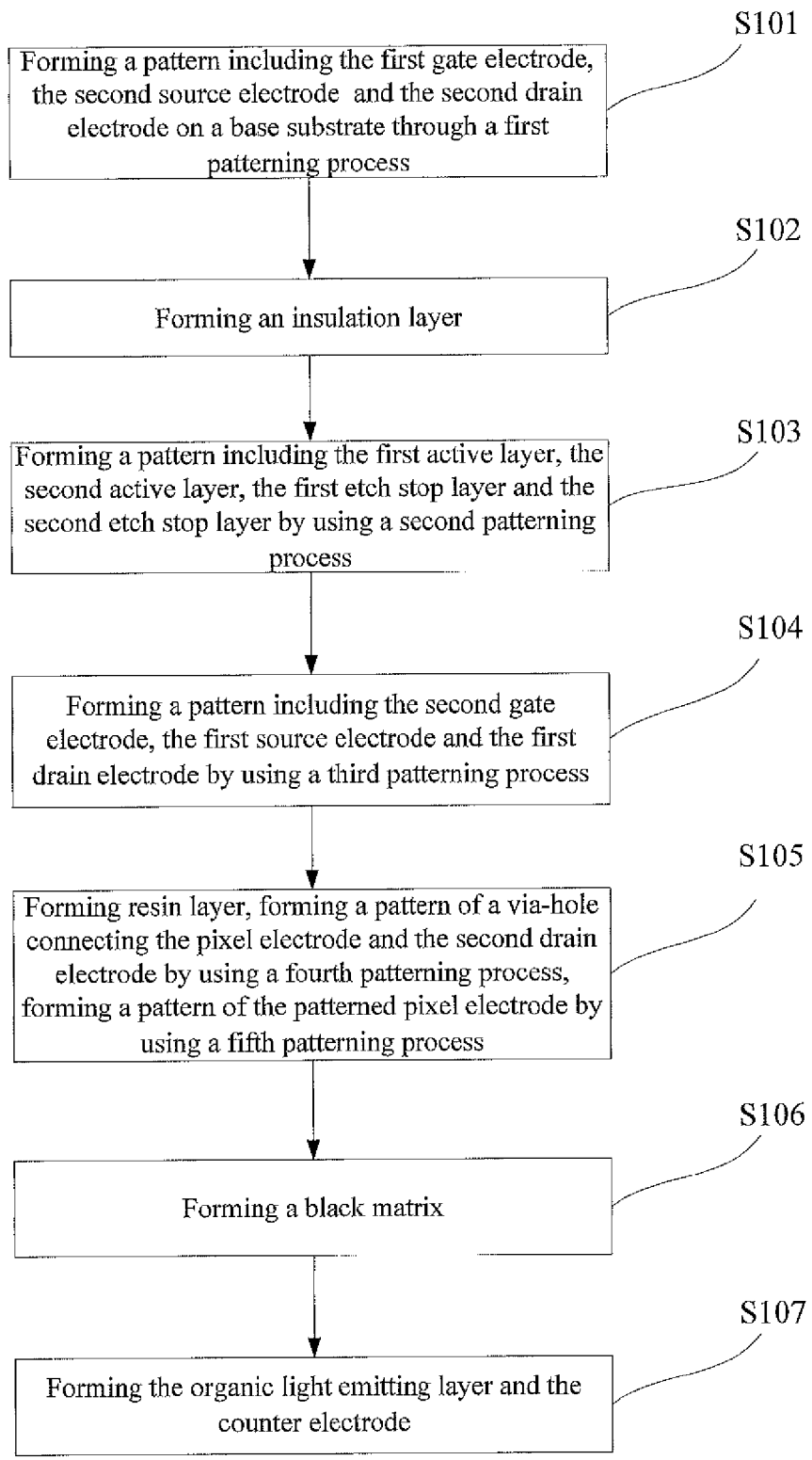
FIG. 3 is a flow chart showing a method for manufacturing an array substrate according to an embodiment of the present disclosure.

FIG. 3 is a flow chart showing a method for manufacturing an array substrate according to an embodiment of the present disclosure; and the method includes:

S101, forming a pattern including the first gate electrode 201*a*, the second source electrode 205*b* and the second drain electrode 206*b* on a base substrate 1 through a first patterning process.

Figure 4A:
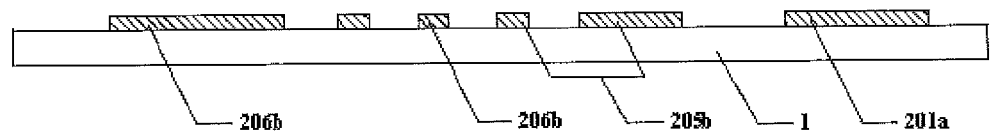
FIGS. 4A-4I are schematic diagrams showing a method for manufacturing an array substrate according to an embodiment of the present disclosure.

Specifically, in an embodiment of the present disclosure, the method includes firstly, providing a base substrate 1, a material of which can be a transparent material such as a glass or a quartz, and also can be a non-transparent material such as a ceramic or a semiconductor material and further can be a flexible material such as a plastic; then forming a metal thin film on the provided base substrate 1 by using for example, a method of depositing, sputtering, etc, wherein the metal thin film can be a monolayer film made of Cr, W, Ti, Ta, Mo, Al, Cu and other metal or alloy and also can be a composite thin film made of multi-layer metal thin films; and then forming a pattern including the first gate electrode 201*a*, the second source electrode 205*b* and the second drain electrode 206*b* on the metal thin film by using a first patterning process. As shown in FIG. 4A, the first gate electrode 201*a*, the second source electrode 205*b* and the second drain electrode 206*b* have a distance arranged therebetween, and are insulated to each other.

Generally, the first patterning process may include processes such as photoresist coating, exposing, developing, etching and peeling off a photoresist, etc.

Furthermore, the method may specifically include forming a gate line 216 and a power line 215 (not shown in FIG. 4A) which is provided on a same layer as the first gate electrode 201*a*, the second source electrode 205*b* and the second drain electrode 206*b* formed above, by using a same patterning process. In this embodiment, the gate line 216 is substantially parallel with the power line 215.

S102, forming a first insulation layer 202.

Figure 4B:
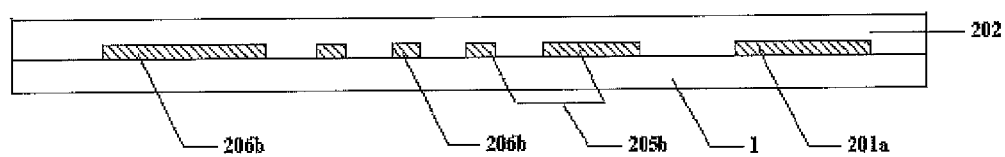

As shown in FIG. 4B, in an embodiment, after completing the S101, the method may specifically include, forming the first insulation layer on the base substrate 1 by using for example, a Plasma Enhanced Chemical Vapor Deposition (PECVD) method. The first insulation layer can be made of a multi-layer composite film which is composed of one or two of silicon oxide (SiOx), silicon nitride (SiNx), hafnium oxide (HfOx), silicon oxynitride (SiON), AlOx and so on.

S103, forming, on the first insulation layer 202 by using a second patterning process, a pattern including the first active layer 203*a*, the second active layer 203*b*, the first etch stop layer 204*a* and the second etch stop layer 204*b*.

Specifically, after completing the S102, the method may specifically include forming sequentially an active layer and an etch stop layer on the formed first insulation layer 202 by for example depositing, sputtering or the like, and forming patterns of the first active layer 203*a*, the second active layer 203*b*, the first etch stop layer 204*a* and the second etch stop layer 204*b* shown in FIG. 2B by using a second patterning process.

Figure 4C:
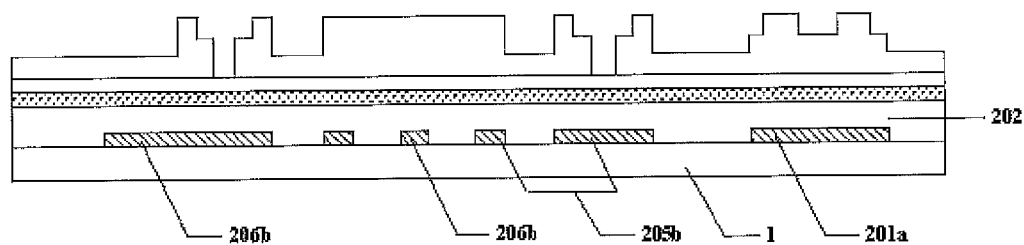
Figure 4D:
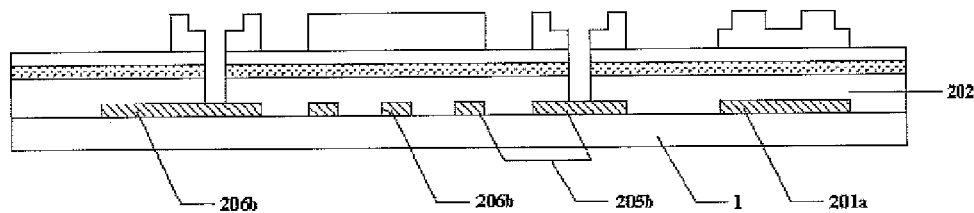
Figure 4E:
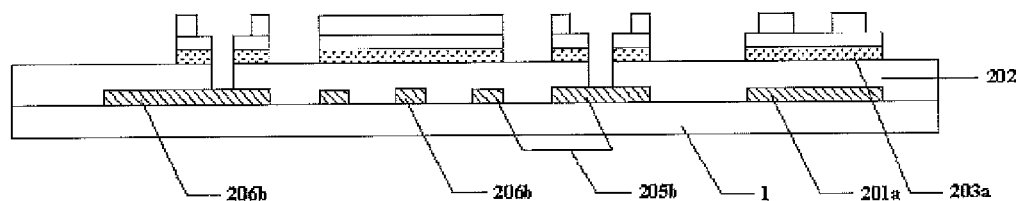

Specifically, the process of forming patterns of the first active layer 203*a*, the second active layer 203*b*, the first etch stop layer 204*a* and the second etch stop layer 204*b* shown in FIG. 2B by using a second patterning process on the active layer and the etch stop layer can be referred to the process as shown in FIGS. 4C-4E.

A layer of a photoresist may be pre-formed on the etch stop layer, and then a structure as shown in FIG. 4C can be obtained by exposing the photoresist using an HTM mask plate. With respect to the HTM mask plate, transmittance intensities corresponding to different regions of the mask plate are different, so that the photoresist can be exposed selectively. In the embodiment of the present disclosure, the HTM mask plate is arranged to have three color tones, that is, includes transparent regions, non-transparent regions and half-transparent regions. Therefore, with respect to the photoresist formed on the etch stop layer, a structure as shown in FIG. 4C, including photoresist-removed regions, photoresist-remained regions and photoresist-half-remained regions can be achieved.

After completing a process shown in FIG. 4C, the method may specifically include performing a first dry etch and a second dry etch onto the etch stop layer, the active layer and the first insulation layer respectively and then ashing a partial of the photoresist. And then, structures as shown in FIG. 4D and FIG. 4E can be obtained.

Alternatively, during the second patterning process, the method may specifically include forming a first via-hole D and a second via-hole E running through the second etch stop layer 204*b*, the second active layer 203*b* and the first insulation layer 202.

Figure 4F:
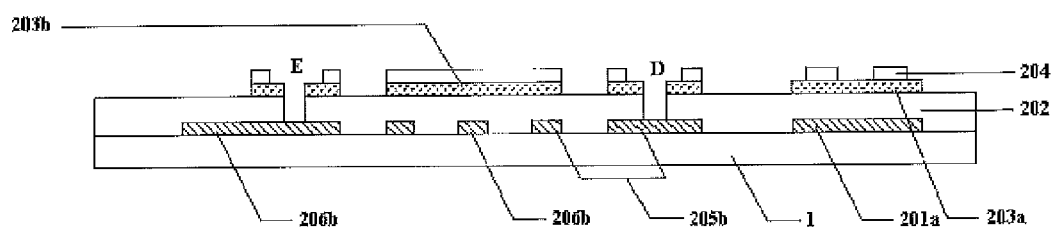

Specifically, in an embodiment of the present disclosure, after completing a process shown in FIG. 4E, a third dry etch can be performed onto the etch stop layer to finally form the first via-hole D and the second via-hole E as shown in FIG. 4F. In FIG. 4F, the first via-hole D and the second via-hole E reveal a cross section of the second etch stop layer 204*b*, a partial upper surface of the second active layer 203*b* and a cross section of the first insulation layer 202. That is, shapes of the first via-hole D and the second via-hole E are stepped shapes.

S104, forming a pattern including the second gate electrode 201*b*, the first source electrode 205*a* and the first drain electrode 206*a* by using a third patterning process.

Figure 4G:
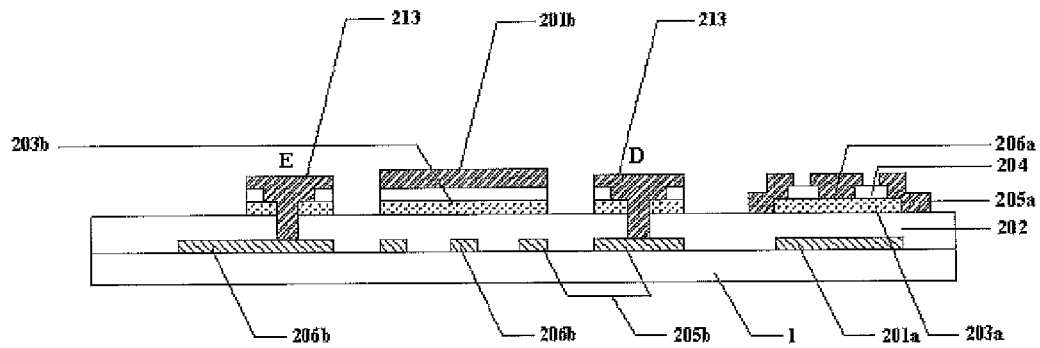

Specifically, as shown in FIG. 4G, after completing a process shown in FIG. 4F, the method may include forming a metal thin film by for example depositing, sputtering or the like, and forming patterns including the second gate electrode 201*b*, the first source electrode 205*a* and the first drain electrode 206*a* by performing a third patterning process onto the metal thin film.

In this embodiment, the second gate electrode 201*b*, the first source electrode 205*a* and the first drain electrode 206*a* are provided on a same layer; and the second gate electrode 201*b* and the first drain electrode 206*a* are integrated together. Therefore, it can be achieved that the drain electrode of the first thin film transistor TFT1 and the gate electrode of the second thin film transistor TFT2 are connected to each other and there is no need to provide a metal connecting line separately, which can enlarge the effective light-emitting display regions, and improve the aperture ratio of the OLED displays.

Furthermore, in order to simplify the manufacturing process, as shown in FIG. 4G, the first connecting line 213*d* and the second connecting line 213*e* provided on a same layer as the second gate electrode 201*b* may be formed by using the same patterning process as that used in forming the second gate electrode 201*b*. The second source electrode 205*b* and the second active layer 203*b* are electrically connected through the first connecting line 213d and the first via-hole D, and the second drain electrode and the second active layer 203b are electrically connected through the second connecting line 213e and the second via-hole E.

Figure 4H:
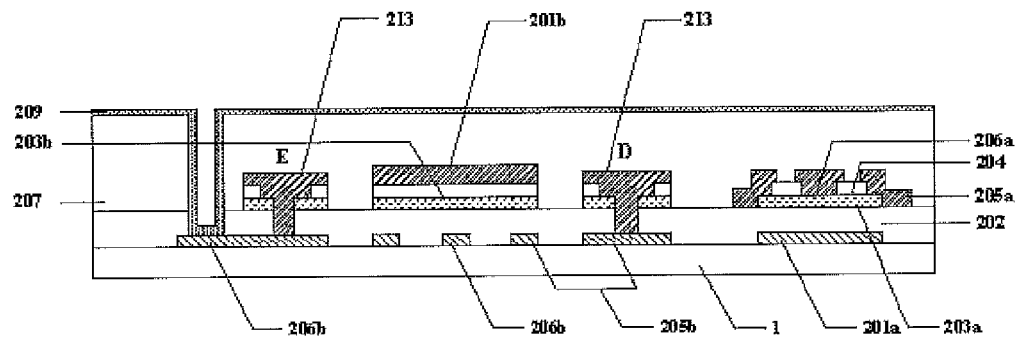

S105, forming resin layer 207. And as shown in FIG. 4H, the method may specifically include forming a pattern of a via-hole connecting the pixel electrode 209 and the second drain electrode 206b by using a fourth patterning process, and then forming a pattern of the patterned pixel electrode 209 by using a fifth patterning process.

Specifically, in an embodiment of the present disclosure, for example, a coating method can be used in the step of forming the resin layer 207. The third via-hole F connecting the pixel electrode 209 and the second drain electrode 206b is formed by using the fourth patterning process, and is located above the second drain electrode 206b. Alternatively, the resin layer 207 is insulated, and its upper surface is substantially a horizontal plane, which can function as an overcoat layer, so as to enable a thickness of the organic light emitting layer formed on the pixel electrode to be uniform and ensure a brightness uniformity of the OLED display.

Figure 1B:
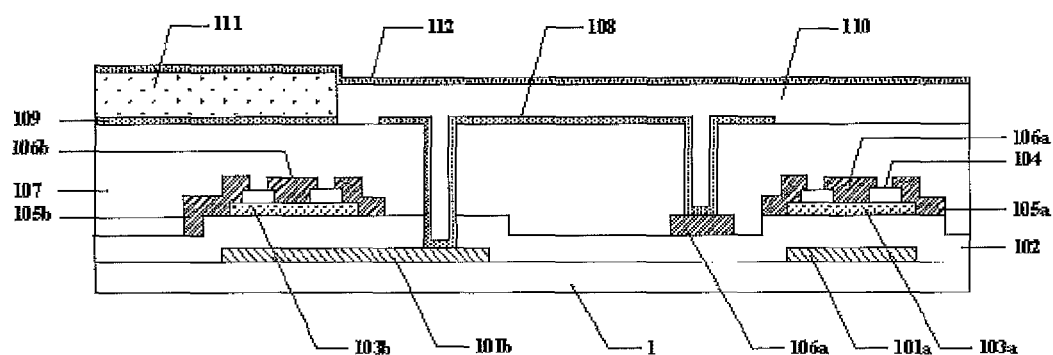
FIG. 1B is a cross-section view showing a partial structure of an array substrate in the prior art.

In an embodiment of the present disclosure, after completing the above steps, the method may specifically include forming the pattern of the pixel electrode 209 on the resin layer by using a fifth patterning process. In this embodiment, there is no need to provide a metal connecting line 108 as shown in FIG. 1B separately, thus there is no need to consider the short circuit problem of the pixel electrode. Therefore, the pixel electrode 209 overlaying the entire sub-pixel region can be formed in each of the sub-pixel regions, as shown in the broken line box in FIG. 2A.

S106, forming a black matrix (a sixth patterning process).

Specifically, after completing a process shown in FIG. 4H, the method may include coating and patterning a black resin, and then forming the black matrix which defines each of the sub-pixel regions and plays a role of light blocking. A projection of the black matrix in a direction perpendicular to the array substrate coincides with those of the data line and the gate line in the same direction, and a width of the black matrix is slightly larger than those of the data line and the gate line.

Figure 4I:
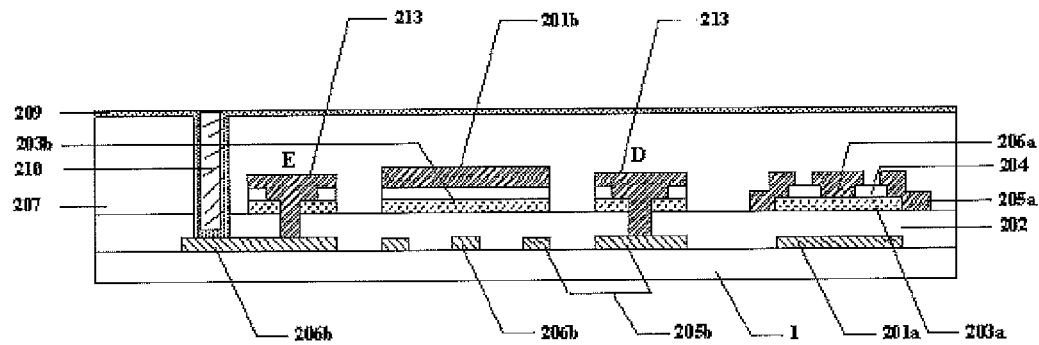

Furthermore, in an embodiment, the method may specifically includes filling, inside the third via-hole F, a black matrix 210 which is located substantially in a same horizontal plane as an upper surface of the pixel electrode 209, as shown in FIG. 4I, thereby enabling a thickness of the organic light emitting layer 211 formed on the pixel electrode 209 and a brightness of the OLED display to be uniform.

S107, forming the organic light emitting layer 211, and forming a pattern of the counter electrode 212 on the organic light emitting layer 211 by using a last patterning process, as shown in FIG. 2B.

For the method for manufacturing the array substrate provided by the embodiment of the present disclosure, on one hand, the etch stop layer and the active layer are formed by using the same patterning process, which reduces another mask process and reduces the difficulty of the process, thereby improving productivity and the product yield; on the other hand, the first thin film transistor having a bottom gate structure and the second thin film transistor having a top gate structure are formed, the gate electrode of the second thin film transistor and the source electrode and the drain electrode of the first thin film transistor are provided on a same layer, and the gate electrode of the second thin film transistor and drain electrode of the first thin film transistor are integrated together. Therefore, there is no need to provide a metal connecting line separately to connect the gate electrode of the second thin film transistor and the drain electrode of the first thin film transistor, which can enlarge the effective light-emitting display regions, and improve the aperture ratio of the OLED displays.

An embodiment of the present disclosure further provides a display device, including any of the above array substrates. Specifically, the display device can be but is not limited to: liquid crystal panels, electronic papers, OLED panels, liquid crystal TVs, liquid crystal monitors, digital photo frames, mobile phones, tablet PCs and any other products or components having display functions.

In an embodiment, the display device is an OLED panel or a display.

An embodiment of the present disclosure further provides an electronic product, including any of the above display devices.

Obviously, a person skilled in the art can carry out various modifications and variations to embodiments of the present disclosure, without departing from the spirit and scope of the present disclosure. Thus, if such modifications and variations of the present disclosure fall within the scope of the claims of the present disclosure and the equivalent technologies thereof, the present disclosure is also intended to comprise these modifications and variations.

What is claimed is:

1. An array substrate, comprising a plurality of sub-pixel regions arranged in a matrix form, wherein each sub-pixel region at least comprises a first thin film transistor (TFT) and a second thin film transistor; the first thin film transistor comprises a first gate electrode, a first source electrode and a first drain electrode; and the second thin film transistor comprises a second gate electrode, a second source electrode and a second drain electrode, wherein
    the first gate electrode and at least one of the second source electrode and the second drain electrode are provided on a same layer;
    the second gate electrode and at least one of the first source electrode and the first drain electrode are provided on a same layer;
    the second gate electrode and at least one of the first source electrode and the first drain electrode are integrated together, or the first gate electrode and at least one of the second source electrode and the second drain electrode are integrated together; and
    wherein the first thin film transistor further comprises a first active layer, the second thin film transistor further comprises a second active layer, and the first active layer and the second active layer are provided on a same active layer.

2. The array substrate according to claim 1, wherein the first thin film transistor functions as a switching transistor, and the second thin film transistor functions as a driving transistor;
    the first gate electrode, the second source electrode and the second drain electrode are provided on a same layer;
    the second gate electrode, the first source electrode and the first drain electrode are provided on a same layer; and
    the second gate electrode and the first source electrode are integrated together.

3. The array substrate according to claim 1, further comprising:
    a gate line electrically connected to the first gate electrode, and a power line electrically connected to the second source electrode, wherein the gate line, the power line, the first gate electrode, the second source electrode and the second drain electrode are provided on a same layer; and the gate line is substantially parallel with the power line.

4. The array substrate according to claim 1, further comprising:
a first insulation layer located above the first gate electrode, the second source electrode and the second drain electrode; and
an etch stop layer (ESL),
wherein the active layer and the etch stop layer are sequentially formed on the first insulation layer by using a same patterning process,
wherein the etch stop layer comprises a first etch stop layer and a second etch stop layer;
the first active layer is located above the first gate electrode, the second active layer is located above the second source electrode and the second drain electrode; and
the first etch stop layer overlays a region of the first active layer which is not overlaid by the first source electrode and the first drain electrode, and the second etch stop layer overlays the second active layer.

5. The array substrate according to claim 4, further comprising:
a first via-hole, a first connecting line, a second via-hole and a second connecting line,
wherein the first connecting line, the second connecting line and the second gate electrode are provided on a same layer;
the second source electrode is electrically connected to the second active layer through the first connecting line and the first via-hole; and
the second drain electrode is electrically connected to the second active layer through the second connecting line and the second via-hole.

6. The array substrate according to claim 5, wherein the first via-hole and the second via-hole run through the second etch stop layer, the second active layer and the first insulation layer, and reveal a cross section of the second etch stop layer, a partial upper surface of the second active layer and a cross section of the first insulation layer.

7. The array substrate according to claim 5, further comprising:
a resin layer and a pixel electrode, located above the first thin film transistor and the second thin film transistor,
wherein there is a third via-hole through the resin layer, the third via-hole is located above the second drain electrode; and
the pixel electrode is electrically connected to the second drain electrode through the third via-hole.

8. The array substrate according to claim 7, wherein there provides a black matrix inside the third via-hole in which the pixel electrode is formed, and an upper surface of the black matrix located inside the third via-hole and an upper surface of the pixel electrode located outside the third via-hole are substantially located in a same horizontal plane.

9. The array substrate according to claim 4, wherein the first insulation layer is made up of a multi-layer composite film which is composed of one or two of silicon oxide (SiOx), silicon nitride (SiNx), hafnium oxide (HfOx), silicon oxynitride (SiON) and AlOx.

10. A display device, at least comprising an array substrate, wherein the array substrate comprises a plurality of sub-pixel regions arranged in a matrix form, wherein each sub-pixel region at least comprises a first thin film transistor (TFT) and a second thin film transistor; the first thin film transistor comprises a first gate electrode, a first source electrode and a first drain electrode; and the second thin film transistor comprises a second gate electrode, a second source electrode and a second drain electrode, wherein
the first gate electrode and at least one of the second source electrode and the second drain electrode are provided on a same layer;
the second gate electrode and at least one of the first source electrode and the first drain electrode are provided on a same layer;
the second gate electrode and at least one of the first source electrode and the first drain electrode are integrated together, or the first gate electrode and at least one of the second source electrode and the second drain electrode are integrated together; and
the first thin film transistor further comprises a first active layer, the second thin film transistor further comprises a second active layer, and the first active layer and the second active layer are provided on a same active layer.

11. The display device according to claim 10, wherein the first thin film transistor functions as a switching transistor, and the second thin film transistor functions as a driving transistor;
the first gate electrode, the second source electrode and the second drain electrode are provided on a same layer;
the second gate electrode, the first source electrode and the first drain electrode are provided on a same layer; and
the second gate electrode and the first source electrode are integrated together.

12. The display device according to claim 10, further comprising:
a gate line electrically connected to the first gate electrode, and a power line electrically connected to the second source electrode,
wherein the gate line, the power line, the first gate electrode, the second source electrode and the second drain electrode are provided on a same layer; and the gate line is substantially parallel with the power line.

13. The display device according to claim 10, further comprising:
a first insulation layer located above the first gate electrode, the second source electrode and the second drain electrode; and
an etch stop layer (ESL),
wherein the active layer and the etch stop layer are sequentially formed on the first insulation layer by using a same patterning process,
the etch stop layer comprises a first etch stop layer and a second etch stop layer;
the first active layer is located above the first gate electrode, the second active layer is located above the second source electrode and the second drain electrode; and
the first etch stop layer overlays a region of the first active layer which is not overlaid by the first source electrode and the first drain electrode, and the second etch stop layer overlays the second active layer.

14. The display device according to claim 13, further comprising:
a first via-hole, a first connecting line, a second via-hole and a second connecting line,
wherein the first connecting line, the second connecting line and the second gate electrode are provided on a same layer;

the second source electrode is electrically connected to the second active layer through the first connecting line and the first via-hole; and the second drain electrode is electrically connected to the second active layer through the second connecting line and the second via-hole.

15. The display device according to claim 14, wherein the first via-hole and the second via-hole run through the second etch stop layer, the second active layer and the first insulation layer, and reveal a cross section of the second etch stop layer, a partial upper surface of the second active layer and a cross section of the first insulation layer.

* * * * *